(12) United States Patent
Bae et al.

(10) Patent No.: US 8,558,458 B2
(45) Date of Patent: Oct. 15, 2013

(54) EXIT LIGHT AND EMERGENCY LIGHT WHICH HAVE FUNCTION TO INDICATE RESIDUAL CHARGE OF BATTERY

(75) Inventors: SangMin Bae, Daejeon (KR); Woo Seog Ryu, Daejeon (KR); TaeKook Kim, Daejeon (KR); YoungGerl Ryu, Daejeon (KR)

(73) Assignee: Korea Atomic Energy Research Institute (KR)

( * ) Notice: Subject to any disclaimer, the term of this patent is extended or adjusted under 35 U.S.C. 154(b) by 313 days.

(21) Appl. No.: 13/043,197

(22) Filed: Mar. 8, 2011

(65) Prior Publication Data

US 2011/0221347 A1   Sep. 15, 2011

(30) Foreign Application Priority Data

Mar. 10, 2010 (KR) .................. 10-2010-0021274

(51) Int. Cl.
*H05B 37/00* (2006.01)

(52) U.S. Cl.
USPC .............................. 315/86; 315/129; 315/136

(58) Field of Classification Search
USPC ............. 315/86, 87, 119, 120, 129, 135, 136; 320/134–136
See application file for complete search history.

(56) References Cited

U.S. PATENT DOCUMENTS

| | | | | |
|---|---|---|---|---|
| 3,836,815 A | * | 9/1974 | Herzog | 315/86 |
| 4,876,632 A | | 10/1989 | Osterhout et al. | |
| 4,890,004 A | * | 12/1989 | Beckerman | 307/66 |
| 5,303,124 A | * | 4/1994 | Wrobel | 362/20 |
| 5,471,114 A | * | 11/1995 | Edwards et al. | 315/86 |
| 5,955,844 A | * | 9/1999 | Redgate | 315/86 |
| 7,466,081 B2 | * | 12/2008 | Schweigert | 315/86 |
| 2005/0088100 A1 | * | 4/2005 | Chen et al. | 315/86 |

FOREIGN PATENT DOCUMENTS

| | | |
|---|---|---|
| JP | 1986-200481 | 9/1986 |
| JP | 1994-0037714 | 2/1994 |
| JP | 1998-042489 | 2/1998 |
| JP | 2001-0157368 | 6/2001 |
| JP | 2002-0373514 | 12/2002 |

(Continued)

*Primary Examiner* — Tung X Le
(74) *Attorney, Agent, or Firm* — Sheridan Ross PC (57) ABSTRACT

An exit light and an emergency light which have a function to indicate a residual charge of a storage battery are provided for users to efficiently check the residual charge of the battery by using a bar graph indicating unit formed on a front portion. The exit light and the emergency light each includes a power input unit which receives a utilized voltage input, decreases the voltage input and applies the voltage input to a rectifier circuit unit; the rectifier circuit which transforms AC power applied from the power input unit into DC power and applies the DC power to a power supply unit; the power supply unit which applies the DC power applied from the rectifier circuit to a light emitting unit or a charging circuit; the light emitting unit which emits light by using the DC power applied from the power supply unit; the charging circuit which supplies the DC power applied from the power supply unit to a storage battery and charges the storage battery; the storage battery which is charged with the DC power applied from the charging circuit; a bar graph indicating unit which indicates a residual charge of the storage battery; and a check switch which, in response to switching-on by a user for checking, cuts off the utilized power and discharges the charge of the storage battery through the bar graph indicating unit so that the residual charge of the storage battery is indicated on the bar graph indicating unit.

14 Claims, 5 Drawing Sheets

(56) References Cited

FOREIGN PATENT DOCUMENTS

| KR | 10-1996-12905 | 4/1996 |
|---|---|---|
| KR | 20-0168319 | 11/1999 |
| KR | 20-0422353 | 7/2006 |
| KR | 2008-0045357 | 5/2008 |
| KR | 2008-0062203 | 7/2008 |
| KR | 2008-0101585 | 12/2008 |
| KR | 2009-0079001 | 7/2009 |
| KR | 2009-0116007 | 11/2009 |

* cited by examiner

| time (minute) | Ib (mA) | Vb (Volt) | Est. RC (mAh) | Mea. RC (mAh) | Error (%) |
|---|---|---|---|---|---|
| 1 | 218.8 | 3.516 | 444.0 | 444.0 | 0.00% |
| 2 | 215.0 | 3.388 | 436.6 | 436.6 | 0.00% |
| 3 | 210.0 | 3.344 | 426.3 | 427.5 | 0.29% |
| 4 | 205.0 | 3.305 | 413.4 | 417.8 | 1.07% |
| 5 | 198.8 | 3.271 | 397.9 | 407.4 | 2.33% |
| 6 | 190.8 | 3.234 | 380.3 | 396.3 | 4.04% |
| 7 | 180.8 | 3.189 | 361.0 | 384.3 | 6.07% |
| 8 | 169.7 | 3.148 | 340.5 | 371.5 | 8.35% |
| 9 | 151.9 | 3.110 | 317.9 | 357.7 | 11.12% |
| 10 | 103.2 | 3.023 | 292.1 | 342.9 | 14.82% |
| 11 | 57.7 | 2.833 | 269.5 | 327.1 | 17.62% |
| 12 | 44.1 | 2.782 | 246.2 | 310.1 | 20.63% |
| 13 | 36.5 | 2.753 | 223.8 | 291.9 | 23.33% |
| 14 | 31.6 | 2.733 | 202.6 | 272.4 | 25.64% |
| 15 | 28.2 | 2.717 | 182.8 | 251.5 | 27.32% |
| 16 | 25.6 | 2.704 | 164.5 | 229.0 | 28.17% |
| 17 | 23.4 | 2.693 | 147.9 | 204.9 | 27.80% |
| 18 | 21.6 | 2.684 | 132.7 | 179.1 | 25.89% |
| 19 | 20.0 | 2.676 | 118.3 | 151.3 | 21.80% |
| 20 | 18.8 | 2.668 | 105.4 | 121.6 | 13.31% |

EXIT LIGHT AND EMERGENCY LIGHT WHICH HAVE FUNCTION TO INDICATE RESIDUAL CHARGE OF BATTERY

CROSS REFERENCE TO RELATED APPLICATIONS

This application claims priority from Korean Patent Application No. 10-2010-0021274, filed on Mar. 10, 2010, in the Korean Intellectual Property Office, the disclosure of which is incorporated herein by reference in its entirety.

BACKGROUND OF THE INVENTION

1. Field of the Invention

The invention relates to an exit light and an emergency light which have function to indicate residual charge of a battery.

2. Description of the Related Art

An exit light and an emergency light are escape apparatuses which last for 60 minutes when a building experiences a fire and a power outage. A storage battery is generally used as an energy source of the escape apparatus to sustain for a certain period of time.

When the storage battery is aged and out, the exit light and the emergency light cannot perform for a certain period of time. Therefore, how well the storage battery is charged is important for the operation of the escape apparatus.

Conventionally, it was necessary to turn off the general exit light and emergency light for a certain period of time to check the residual charge of battery thereof. However, it requires quite a long time to check batteries of many exit lights and emergency lights, and availability of the lights for operation is hardly evaluated after the check.

To solve the problems, users do not turn off the exit light and emergency light but operate check switch to determine the state of exit light and emergency light.

However, even if the check switch indicates no malfunction sign, it does not guarantee that exit light and emergency light will maintain for a certain period of time.

In operation, the check switch of the exit light and emergency light indicates through green LED the state of utilized power supply, and charged or discharged state through red LED, but the check switch does not indicate the residual charge of the battery.

Manufacturers can check the abnormality of the general exit light and emergency light, but users cannot check the residual charge of the battery.

SUMMARY OF THE INVENTION

Exemplary embodiments overcome the above disadvantages and other disadvantages not described above. Also, the embodiments are not required to overcome the disadvantages described above, and an exemplary embodiment of the present invention may not overcome any of the problems described above.

An aspect of the present disclosure provides an exit light and an emergency light for users to efficiently check the residual charge of a battery by using a bar graph indicating unit formed on a front portion.

To be specific, the exit light and the emergency light are provided, which indicate fixing state and residual charge of batteries in response to a switching-on of a check switch.

In order to achieve the above-mentioned objectives of the present disclosure, in one embodiment, an exit light and an emergency light which have a function of indicating residual charge of a battery may include a power input unit 110 which receives a utilized voltage input, decreases the voltage input and applies the voltage input to a rectifier circuit unit 120, the rectifier circuit 120 which transforms AC power applied from the power input unit 110 into DC power and applies the DC power to a power supply unit 130, the power supply unit 130 which applies the DC power applied from the rectifier circuit (120) to a light emitting unit (140) or a charging circuit (150), the light emitting unit (140) which emits light using the DC power applied from the power supply unit (130), the charging circuit (150) which supplies the DC power applied from the power supply unit (130) to a storage battery (160) to charge the storage battery (160), the storage battery (160) which is charged with the DC power applied from the charging circuit (150), a bar graph indicating unit (170) which indicates a residual charge of the storage battery (160), and a check switch (180) which, in response to switching-on by a user, cuts off the utilized power and discharges the charge of the storage battery (160) through the bar graph indicating unit (170) so that the residual charge of the storage battery (160) is indicated on the bar graph indicating unit (170).

The exit light and the emergency light according to an embodiment may additionally include an emergency power control unit (190) which supplies the charge of the storage battery (160) to the light emitting unit (140) through the power supply unit (130) to lighten the exit light through the light emitting unit (140) in an event of an emergency in which a utilized power is blocked.

The charging circuit (150) controls the DC power supplied from the power supply unit (130) and supplies the DC power to the storage battery (160) to charge the storage battery (160)

The charging circuit (150) includes a first light emitting diode which is turned on to indicate an abnormality of the storage battery (160) if the storage battery (160) can not be charged or if the charging circuit (150) can not be connected to the storage battery (160).

The storage circuit (160) includes a second light emitting diode and indicates input of the utilized power by turning on the second light emitting diode using the DC power applied from the power supply unit (130).

The bar graph indicating unit (170) includes variable resistance which indicates the residual charge of the storage battery (160) by controlling so that decrease of discharge voltage of the storage battery (160) and decrease of the bar graph are kept proportional to each other.

The bar graph indicating unit (170) operates only when the check switch (180) operates to indicate the residual charge of the storage battery (160), but does not operate when the utilized power is not supplied.

As explained above, the exit light and the emergency light according to an embodiment have a function to indicate residual charge of the storage battery and facilitate user's check on the residual charge of the storage battery with a bar graph indicating unit provided on a front face thereof.

Furthermore, since the check switch, upon switched on, indicates residual charge of the storage battery as well as state of the utilized power and the charged/discharged state, unlike the conventional exit light and conventional emergency light which have to be turned off for a certain period of time for check on the residual charge of the storage battery, the exit light and the emergency light according to an embodiment can be maintained more effectively.

Furthermore, thanks to efficient check and repair, the function of the exit light and the emergency light according to an embodiment is maintained even in the event of emergency.

Accordingly, the exit light and the emergency light according to an embodiment may be included in new plants includ-

DETAILED DESCRIPTION OF EXEMPLARY EMBODIMENTS

Exemplary embodiments will be explained in greater detail below with reference to the accompanying drawings. In the drawings, the same or like components or devices are represented as the same reference numerals or symbols. Further, detailed explanations of the known functions or components will be skipped to avoid ambiguity of the embodiments.

Figure 1:
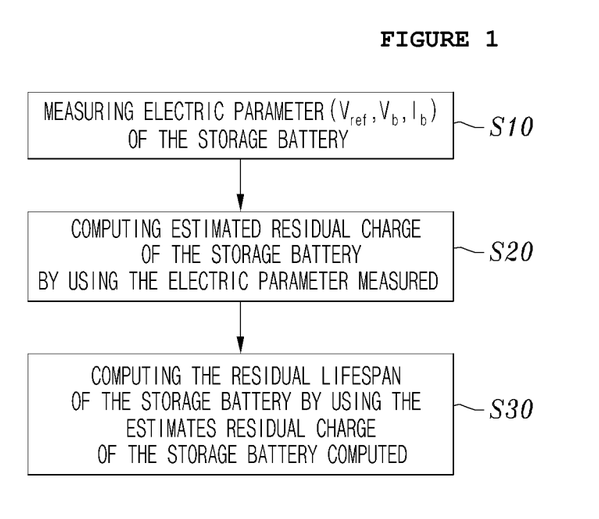
FIG. 1 is a block diagram of inner structure of an exit light and an emergency light with a function of displaying the residual charge of a storage battery according to an embodiment.

FIG. 1 is a block diagram of an inner structure of an exit light and an emergency light with a function of displaying the residual charge of a storage battery according to an embodiment.

As illustrated in FIG. 1, the exit light and the emergency light with a function of displaying the residual charge of storage battery each includes a power input unit (11), a rectifier circuit (120), a power supply unit (130), a light emitting unit (140), a charging circuit (150), a storage battery (160), a bar graph indicating unit (170), a check switch (180) and an emergency power control unit (190).

The power input unit (110) receives an outside utilized power, applies the utilized power to a transformer to decrease voltage, and applies the voltage to the rectifier circuit (120).

The rectifier circuit (120) transforms AC power applied from the power input unit (110) into DC power and applies the DC power to the power supply unit (130).

The power supply unit (130) applies DC power applied from the rectifier circuit (120) to the light emitting unit (140) or the charging circuit (150).

The light emitting unit (140) emits light using the DC power applied from the power supply unit (130). The light emitting unit (140) may use a light emitting device such as LED to emit and light up a place where an exit light or an emergency light is installed, but a light emitting device of the light emitting unit according to an embodiment is not limited to the above specific example only.

The storage battery (150) regulates the DC power applied from the power supply unit (130) to be suitable for charging the storage battery (160) and supplies the DC power to the storage battery (160) to charge the storage battery (160).

The charging circuit (150) includes a first light emitting diode (not illustrated). The light emitting diode may indicate presence of abnormality of the storage battery (160) by lighting the first light emitting diode if the storage battery (160) is not charged or the charging circuit (150) and the storage battery (160) are not electrically connected to each other.

The charging circuit (150) may additionally include a second light emitting diode (not illustrated), and indicate the input state of the utilized power by lighting the second light emitting diode using the DC power applied from the power supply unit (130).

The storage battery (160) is charged with the DC power applied from the charging circuit (150), but this should not be construed as limiting the kinds of the storage battery (160).

The bar graph indicating unit (170) indicates the residual charge of the storage battery (160).

The bar graph indicating unit (170) may include variable resistance (not illustrated) formed therein to indicate the residual charge of the storage battery (160) by controlling so that decrease of discharge voltage of the storage battery (160) and decrease of bar graph are proportional to each other.

The bar graph indicating unit (170) operates only when the check switch (180) operates, to indicate the residual charge of the storage battery (160). The bar graph indicating unit (170) does not operate when the utilized power is not supplied. Therefore, the bar graph indicating device does not decrease the operating time even in the case of blackout.

When a user switches on the check switch 180, the check switch (180) cuts off the utilized power, and discharges the voltage of the storage battery (160) to the bar graph indicating unit (170) so as to indicate the residual charge of the storage battery (160) on the bar graph indicating unit (170).

If utilized power supply is cut off for emergency, the emergency power control unit (190) causes the power of the storage battery (160) to be supplied to the light emitting unit (14) through the power supply unit (130) so that the exit light or emergency light is lighted by the light emitting unit (140). That is, the power input unit (110) applies the utilized power to the light emitting unit (140) in general, but in emergency, the power of the storage battery (160) is provided to the light emitting unit (140) by the emergency power control unit (190).

The residual lifespan of a storage battery according to an embodiment will be explained in greater below.

The total capacity of a battery is a major factor that categorizes a battery and this represents the total electric charge of a battery supplied until the voltage of a battery is dropped to a shut-off voltage. In other words, the total capacity of a battery represents the total amount of electric charges which are generated in oxidation/reduction reactions of positive/negative poles of a battery. The total amount of electric charges is very important factor to be considered in estimating the lifespan of a battery.

When a battery including Li such as Li—Cd is shallow charged/discharged, irreversible reaction occurs in which NiOH forms a solid solution to decrease the residual amount of a battery, resulting in an increased impedance in a battery.

Therefore, to estimate the residual charge and lifespan of a battery, an estimating method should be applied considering non-linear features of a battery, and generally, such non-linear feature appears in the form of changes in electric current or voltage of a battery.

Therefore, an embodiment of the present invention suggests a method of estimating the residual charge and lifespan of a battery according to changes in electric current and voltage of a battery with taking the non-linear feature of a battery into consideration.

In the method of estimating lifespan of a battery according to an embodiment, the decrease characteristic of residual charge of a battery is extracted based on the estimated residual charge of a battery which is obtained with an initial discharging sample test in current state, and the decrease characteristic of the residual charge is computed to thus estimate the available lifespan of a battery.

Although the decrease of residual charge of a storage battery varies depending on loads, LED lamp has non-linear characteristic in which the load remains constant, but the battery voltage and output current decrease according to resistance of impedance in the battery.

In fact, in the experiment of discharging a Ni-MH battery, the residual charge exhibits exponential decrease which is abrupt in a specific region, and then exhibits the characteristic similar to that of the initial discharge characteristic. Therefore, in one embodiment, the residual charge of a battery is estimated under the consideration of the non-linear feature of a storage battery.

Figure 2:
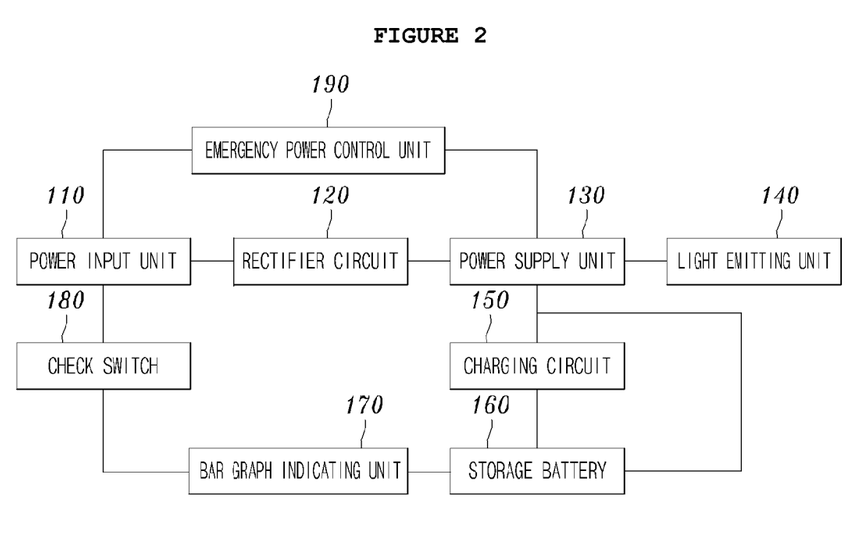
FIG. 2 is a flowchart provided to explain a method for estimating residual lifespan of a storage battery according to an embodiment.

FIG. 2 is a flowchart provided to explain a method for estimating residual lifespan of a storage battery according to an embodiment. As illustrated in FIG. 2, a method for estimating residual lifespan of a storage battery includes step 1 (S10), step 2 (S20), and step 3 (S30).

Step 1 (S10) estimates the electric parameter of a battery. At step 1 (S10), the electric parameter of a battery is estimated, and the estimated electric parameter includes voltage ($V_b$), reference voltage ($V_{ref}$), electric current ($i_b$) of a battery.

Step 2 (S20) computes estimated residual charge of the battery using the electric parameter measured at step 1 (S10).

At Step 2, the estimated residual charge of the battery is computed with mathematical formula 1 and mathematical formula 2 below. The mathematical formula 1 below computes the estimated residual charge of the battery by measuring a rate of the voltage and average current changes of the storage battery.

$$RC = SC^* \left( soc + C^*(1-soc) + \frac{v_b^2 - v_{ref}^2}{K_{soc} * i_b^2} \right)$$ [Mathematical formula 1]

$$soc = \frac{SC - \sum_{k=0}^{t} i_k}{SC}$$ [Mathematical formula 2]

wherein 'RC' is residual charge of a storage battery, 'SC' is a standard capacity of the storage battery obtained within a standard sampling time, 'soc' is a rate of residual charge obtained by subtracting a sum of electric currents obtained until a measurement point of discharge, from the standard capacity of the storage battery obtained within the standard sampling time, '$V_b$' is a voltage of the battery, $V_{ref}$' is a reference voltage of the battery, '$i_b$' is the average value of electric current of the battery obtained for one minute, and 'C' and '$K_{soc}$' are non-linear characteristic constant. As a result of conducting discharging experiment of Ni—Cd battery (450 mA, 3.6V), C is 0.1 and $K_{soc}$ is 3000.

Step 3 (S30) computes the residual lifespan of the storage battery using the estimated residual charge of the battery of step 2 (S20).

At step 3 (S30), the residual lifespan of the storage battery is computed using the estimated residual charge of the battery obtained at step 2 (S20), and by computing the characteristic of decrease of the residual charge of the battery. The characteristic of decrease of residual charge of the battery may be computed by the mathematical formula 3 below.

$$\Delta RC_n = (RC_{n-2} - RC_{n-1})^* \exp^{-\beta} = (1 - \exp^{-\beta})^* RC_{n-1}$$ [Mathematical formula 3]

wherein 'β' is discharging characteristic constant of the battery.

The mathematical formula 3 represents decreasing pattern of residual charge of the storage battery in consideration of the characteristic of the residual charge based on the estimated residual charge of the storage battery, as a result of conducting two or more sampling. Referring to mathematical formula 3, the decrease pattern of residual charge of the battery exhibit exponential decrease with respect to the rate of changes in the residual charge of the storage battery obtained by mathematical formula 1.

Figure 3:
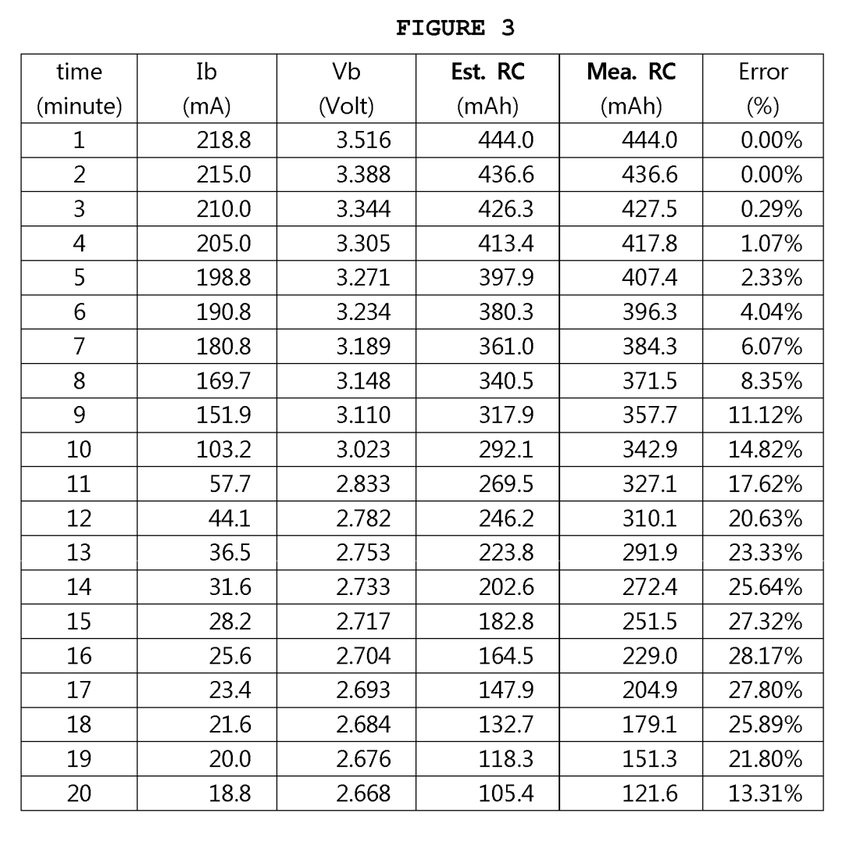
FIG. 3 illustrates test results of residual charge and lifespan based on a discharge test of Ni—Cd battery according to an embodiment in a tabulated form.
Figure 4:
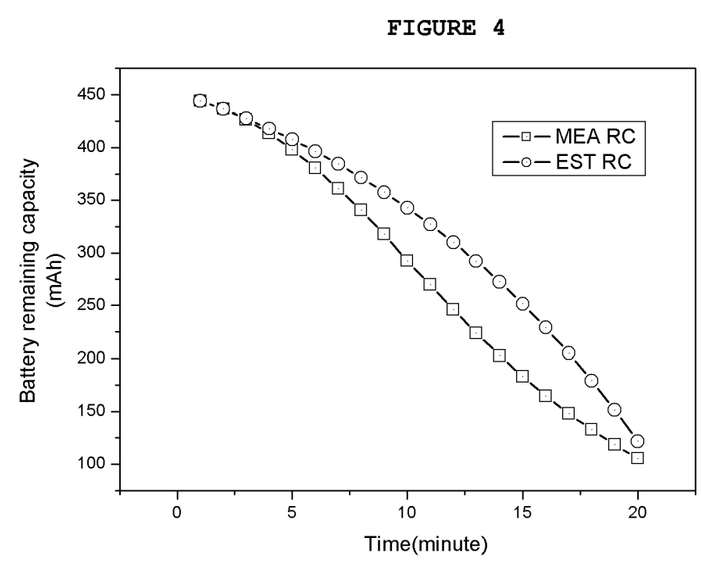
FIG. 4 is a graphical representation of a test result on expected lifespan of Ni—Cd battery according to an embodiment.
Figure 5:
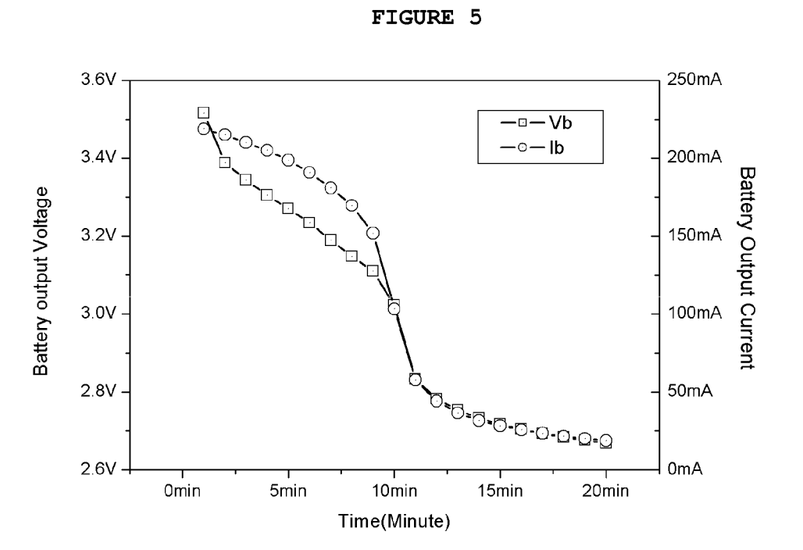
FIG. 5 is a graphical representation of changes in battery voltage ($V_b$) and current ($I_b$) during Ni—Cd battery discharge according to an embodiment.

FIG. 3 illustrates test results of residual charge and lifespan based on a discharge test of Ni—Cd battery according to an embodiment in a tabulated form, FIG. 4 is a graphical representation of a test result on expected lifespan of Ni—Cd battery according to an embodiment; and FIG. 5 is a graphical representation of changes in battery voltage ($V_b$) and current ($I_b$) during Ni—Cd battery discharge according to an embodiment.

The graphical representation of FIG. 4 shows RC estimated by using $I_b$ and $V_b$ measured in every minute in discharged state, and RC estimated by using first and second RC measurements after two times of measurement. Initial discharge exhibits similar pattern but after 10 minutes, as illustrated in FIG. 5, error rate is changed due to the drastic temporary decrease of voltage of the battery. As a result, the average error rate is approximately 14%.

While the exit light and the emergency light with function to indicate residual charge of a battery have been shown and explained so far with reference to the drawings and exemplary embodiments, the exemplary embodiments and drawings are not to be construed as limiting the present inventive concept. Accordingly, it will be understood that various modifications can be made by those skilled in the art without departing from the technical concept of the invention.

What is claimed is:

1. An exit light which has function to indicate residual charge of a storage battery, the exit light comprising:
   a power input unit which receives a utilized voltage input, decreases the voltage input and applies the voltage input to a rectifier circuit unit;
   the rectifier circuit which transforms AC power applied from the power input unit into DC power and applies the DC power to a power supply unit;
   the power supply unit which applies the DC power applied from the rectifier circuit to a light emitting unit or a charging circuit;
   the light emitting unit which emits light by using the DC power applied from the power supply unit;
   the charging circuit which supplies the DC power applied from the power supply unit to a storage battery and charges the storage battery;
   the storage battery which is charged with the DC power applied from the charging circuit;
   a bar graph indicating unit which indicates a residual charge of the storage battery; and
   a check switch which, in response to switching-on by a user for checking, cuts off the utilized power and discharges the charge of the storage battery through the bar graph indicating unit so that the residual charge of the storage battery is indicated on the bar graph indicating unit.

2. The exit light according to claim 1, further comprising an emergency power control unit which supplies the charge of the storage battery to the light emitting unit through the power supply unit to lighten the exit light through the light emitting unit in response to cutoff of the utilized power.

3. The exit light according to claim 1, wherein the charging circuit controls the DC power applied from the power supply unit and supplies the DC power to the storage battery to charge the storage battery, and the charging circuit comprises a first light emitting diode which is turned on to indicate an abnormality of the storage battery if the storage battery cannot be charged, or if the charging circuit cannot be electrically connected to the storage battery.

4. The exit light according to claim 3, wherein the storage circuit comprises a second light emitting diode and indicates input of the utilized power by turning on the second light emitting diode using the DC power applied from the power supply unit.

5. The exit light according to claim 1, wherein the bar graph indicating unit comprises variable resistance which indicates the residual charge of the storage battery by controlling so that decrease of discharge voltage of the storage battery and decrease of the bar graph are kept proportional to each other, and the bar graph indicating unit operates to indicate the residual charge of the storage battery only when the check switch operates, but does not operate when the utilized power is not supplied.

6. An emergency light which has function to indicate residual charge of a storage battery, the emergency light comprising:

a power input unit which receives a utilized voltage input, decreases the voltage input and applies the voltage input to a rectifier circuit unit;

the rectifier circuit which transforms AC power applied from the power input unit into DC power and applies the DC power to a power supply unit;

the power supply unit which applies the DC power applied from the rectifier circuit to a light emitting unit or a charging circuit;

the light emitting unit which emits light by using the DC power applied from the power supply unit;

the charging circuit which supplies the DC power applied from the power supply unit to the storage battery and charges the storage battery;

the storage battery which is charged with the DC power applied from the charging circuit;

a bar graph indicating unit which indicates a residual charge of the storage battery; and a check switch which, in response to switching-on by a user for checking, cuts off the utilized power and discharges the charge of the storage battery through the bar graph indicating unit so that the residual charge of the storage battery is indicated on the bar graph indicating unit.

7. The emergency light according to claim 6, further comprising an emergency power control unit which supplies the charge of the storage battery to the light emitting unit through the power supply unit to lighten the exit light through the light emitting unit in response to cutoff of the utilized power.

8. The emergency light according to claim 6, wherein the charging circuit controls the DC power applied from the power supply unit and supplies the DC power to the storage battery to charge the storage battery, and the charging circuit comprises a first light emitting diode which is turned on to indicate an abnormality of the storage battery if the storage battery cannot be charged, or if the charging circuit cannot be electrically connected to the storage battery.

9. The emergency light according to claim 8, wherein the storage circuit comprises a second light emitting diode and indicates input of the utilized power by turning on the second light emitting diode using the DC power applied from the power supply unit.

10. The emergency light according to claim 6, wherein the bar graph indicating unit comprises variable resistance which indicates the residual charge of the storage battery by controlling so that decrease of discharge voltage of the storage battery and decrease of the bar graph are kept proportional to each other, and the bar graph indicating unit operates to indicate the residual charge of the storage battery only when the check switch operates, but does not operate when the utilized power is not supplied.

11. A method for estimating a residual lifespan of a storage battery, the method comprising the step of:

measuring electric parameter of the storage battery;

computing estimated residual charge of the storage battery by using the electric parameter; and computing the residual lifespan of the storage battery by using the estimated residual charge of the storage battery computed, wherein the estimated residual charge of the storage battery is computed by first and second equations:

$$RC = SC^* \left( soc + C^*(1 - soc) + \frac{v_b^2 - v_{ref}^2}{K_{soc} * i_b^2} \right)$$

and $$soc = \frac{SC - \sum_{k=0}^{t} i_k}{SC}.$$

12. The method according to claim 11, wherein the electric parameter comprises voltage ($V_b$), reference voltage ($V_{ref}$), and current ($i_b$) of the storage battery.

13. The method according to claim 11, wherein the computing of the residual lifespan of the storage battery comprises computing characteristic of decrease of the residual charge of the storage battery by using the estimated residual charge of the storage battery.

14. The method according to claim 13, wherein the decrease characteristic of the residual charge of the storage battery is computed by a third equation:

$$\Delta RC_n = (RC_{n-2} - RC_{n-1})^* \exp^{-\beta} = (1 - \exp^{-\beta})^* RC_{n-1} - RC_{n-2}.$$

* * * * *